(12) United States Patent
Delgado et al.

(10) Patent No.: US 6,274,460 B1
(45) Date of Patent: Aug. 14, 2001

(54) DEFECT GETTERING BY INDUCED STRESS

(75) Inventors: Jose A. Delgado; Craig J. McLachlan, both of Valkaria, FL (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/334,987

(22) Filed: Jun. 17, 1999

Related U.S. Application Data

(62) Division of application No. 09/082,892, filed on May 21, 1998, now Pat. No. 5,929,508.

(51) Int. Cl.[7] .............................................. H01L 21/322
(52) U.S. Cl. ........................ 438/476; 438/402; 438/471
(58) Field of Search .................................. 438/402, 471, 438/472, 476

(56) References Cited

U.S. PATENT DOCUMENTS

| | | |
|---|---|---|
| 3,966,577 | 6/1976 | Hochberg . |
| 4,385,975 | 5/1983 | Chu et al. . |
| 5,084,408 | 1/1992 | Baba et al. . |
| 5,094,973 * | 3/1992 | Pang ..................................... 438/472 |
| 5,217,919 * | 6/1993 | Gaul et al. ............................ 438/402 |
| 5,306,942 * | 4/1994 | Fujii ...................................... 257/508 |
| 5,372,952 | 12/1994 | Aronowitz et al. . |
| 5,416,041 | 5/1995 | Schwalke . |
| 5,443,661 * | 8/1995 | Oguro et al. ......................... 438/402 |
| 5,445,975 * | 8/1995 | Gardner et al. ...................... 438/472 |
| 5,448,102 | 9/1995 | Gaul et al. . |
| 5,478,758 * | 12/1995 | Easter .................................... 438/402 |
| 5,482,869 * | 1/1996 | Kohyama .............................. 438/476 |
| 5,556,793 * | 9/1996 | Adler et al. ........................... 438/402 |

FOREIGN PATENT DOCUMENTS 5 31 48-394    12/1978   (JP) .

* cited by examiner

Primary Examiner—Stephen D. Meier
Assistant Examiner—Jamie L. Brophy
(74) Attorney, Agent, or Firm—Jaeckle Fleischmann & Mugel, LLP

(57) ABSTRACT

The present invention induces provides a gettering trench on the front surface of a device substrate. In one embodiment it induces stress and simultaneously forms a gettering zone 40 for gettering impurities in an integrated circuit structure. In another embodiment, the trench is filled with gettering material 72 such as polysilicon. The two gettering mechanisms may be combined 82,84. The invention is useful for providing gettering in bonded wafers and in silicon-on-insulator devices (FIGS. 4,5).

16 Claims, 7 Drawing Sheets

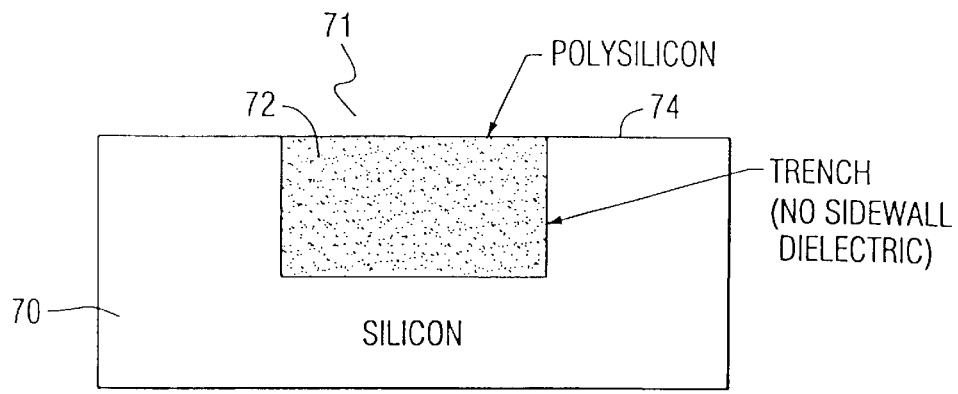
FIG. 6 (OPTION 2)
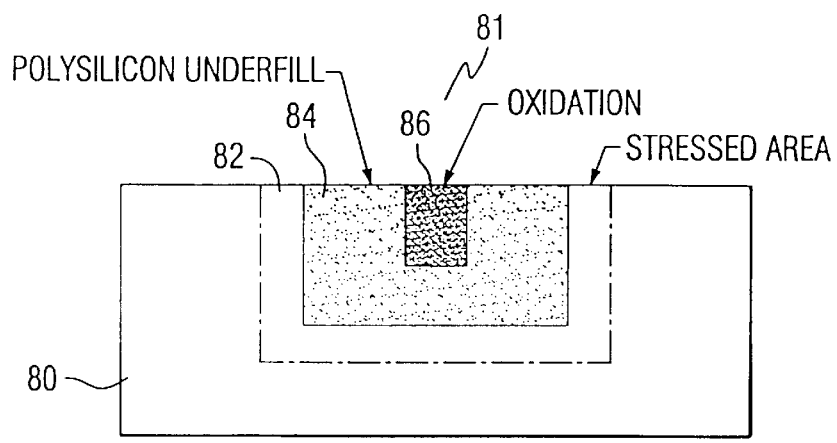
FIG. 7 (OPTION 3)
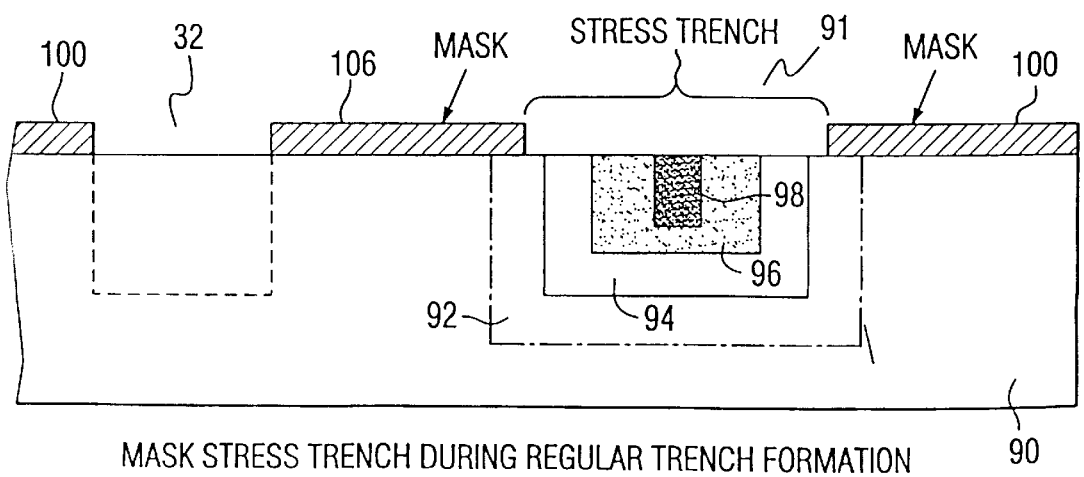
MASK STRESS TRENCH DURING REGULAR TRENCH FORMATION
FIG. 8 (OPTION 4)

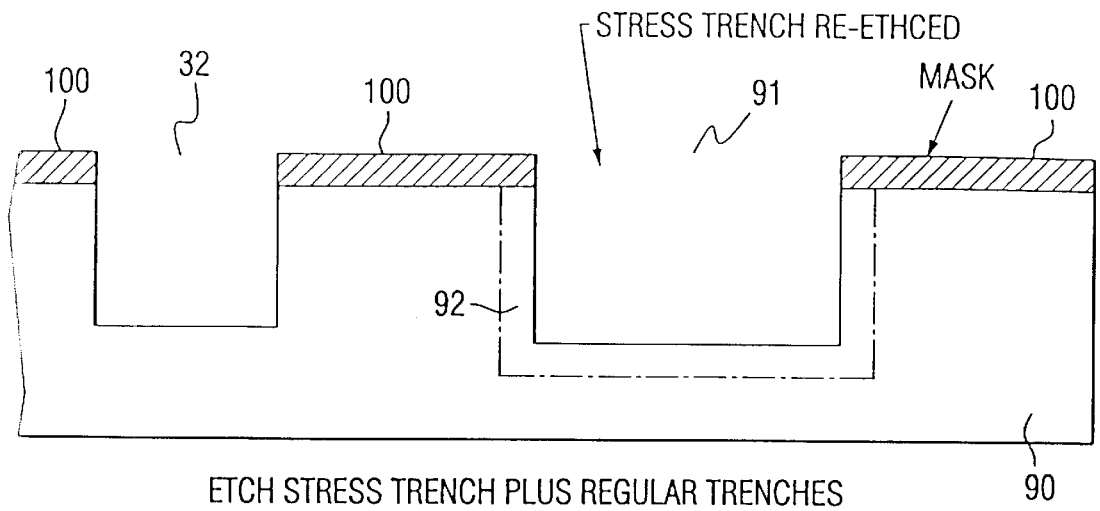
FIG. 9 (OPTION 4)
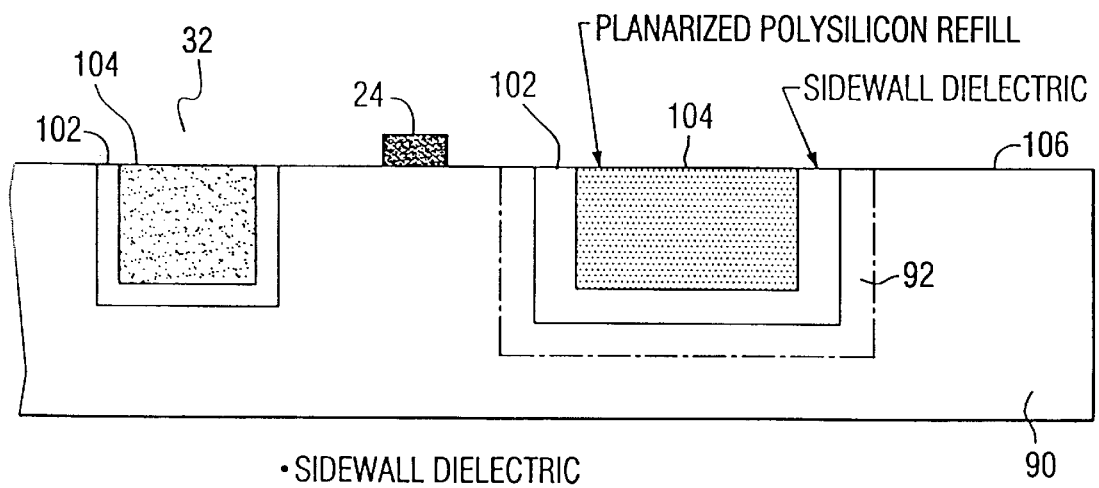
FIG. 10 (OPTION 4)

DEFECT GETTERING BY INDUCED STRESS

CROSS REFERENCES TO RELATED APPLICATIONS

This invention is a division of and claims the benefit of the priority date of U.S. patent application, Ser. No. 09/082,892, filed May 21, 1998 now U.S. Pat. No. 5,929,508.

FIELD OF THE INVENTION

The present invention relates to forming a gettering zone in a semiconductor substrate and, more particularly, to both manufacturing methods and substrate structures for improving device performance by gettering defects in the substrate.

BACKGROUND OF THE INVENTION

Traditionally, trenches in a semiconductor substrate are oxidized and refilled with polysilicon material or entirely filled with deposited oxide. The trench refill process completely fills the trenches and leaves no voids. Voids on the surface of the polysilicon, when oxidized, cause stress within the substrate which subsequently generate yield reducing defects. Manufacturers of semiconductor substrates, therefore, strive to great lengths to avoid stress within the substrate. For example in U.S. Pat. No. 5,448,102 (Gaul et al.), Gaul et al. disclose a process to avoid and reduce stress in a semiconductor substrate that is induced by filling trenches.

Manufacturers also strive to remove or getter impurities. Often heavy elements, such as iron, contaminate device wafers. Those impurities can be attracted to gettering sites that are spaced from the front surface of the wafer where devices are formed. Typical gettering mechanisms include abrading the back surface of the wafer or coating the back surface with a gettering agent, such as polysilicon. Oxygen can be a gettering agent. Thermal processing is used to form zones in the front surface that are denuded of oxygen. Impurities are captured in the remaining oxygen sites that are in the wafer but below the front surface and beneath the denuded zones.

SUMMARY OF THE INVENTION

Contrary to conventional wisdom, we found that some stress in predetermined regions of a semiconductor substrate is beneficial. Such stress creates a getteling zone. The gettering zone attracts impurities in the substrate and is beneficial to the substrate. The gettering zone is located on the front surface of the wafer, preferably in a sacrificial region outside the region holding the integrated circuit.

In contrast to the conventional process to reduce stress, the present invention induces stress and simultaneously form a zone for gettering impurities in an integrated circuit structure. The structure comprises a monocrystalline semiconductor device substrate. The substrate comprises an upper portion suitable for device formation. The upper portion is divided into an active region and an inactive region. There is an integrated circuit or at least one active device on the active region and at least one gettering trench on the inactive area. The gettering trench comprises a dielectric layer on the sidewalls and the floor of the trench and the remainder of the trench comprises a filling material. At least one void is fabricated within the filling material. The material defining the void is polysilicon. When it is oxidized, pressure is applied to the substrate. That pressure induces stress in the adjacent inactive region and generates defects in the crystal lattice structure of the monocrystalline semiconductor. The defects create a gettering zone that surrounds the trench and attracts impurities.

The gettering site is in the front surface of the device wafer. The location is especially useful in bonded and silicon-on-insulator wafers. Those wafers have an oxide layer on the back side of the device wafer. The oxide blocks conventional back side gettering mechanisms. In an alternate embodiment, the gettering site is a trench filled with polysilicon and without voids or oxidation. The polysilicon acts as a gettering agent. The gettering trench is laterally spaced from the integrated circuit to draw the impurities away from it.

In another embodiment the stressed trench and the polysilicon trench are combined. That embodiment provides a gettering site with two gettering mechanisms for drawing impurities away from the integrated circuit: the defects surrounding the gettering trench and the polysilicon inside the trench.

BRIEF DESCRIPTION OF THE DRAWINGS

FIG. 6 is a fourth embodiment;

FIG. 7 is a fifth embodiment;

FIGS. 8–10 show process steps for simultaneously forming gettering trenches and isolation trenches.

DETAILED DESCRIPTION OF THE PRESENT INVENTION

Figure 1:
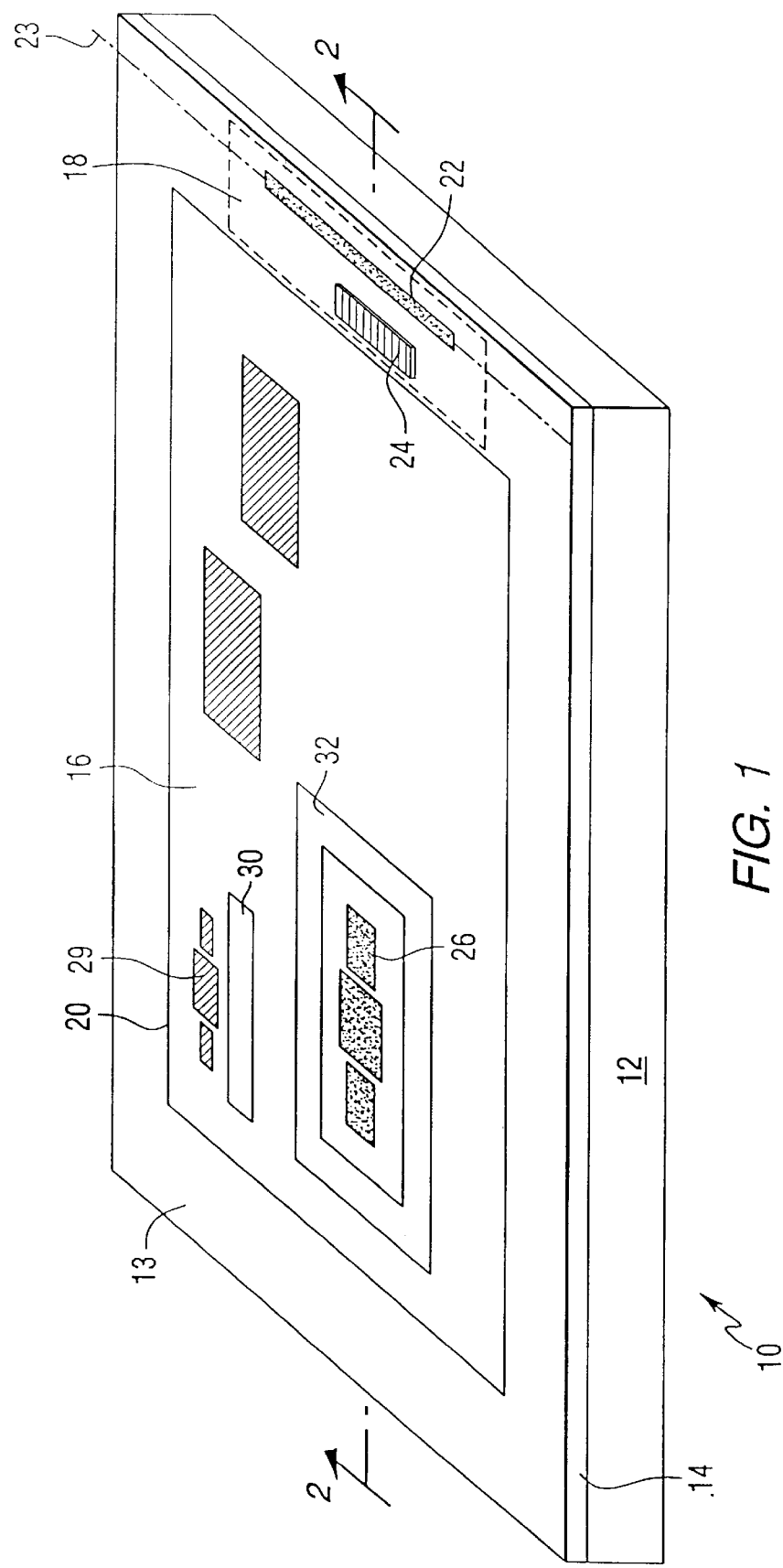
FIG. 1 is an isometric view of a first embodiment of the present invention.

FIG. 1 illustrates an integrated circuit structure 10 with the invention. The structure 10 comprises a monocrystalline semiconductor device substrate 12 of silicon or other suitable material. The substrate 12 has a front surface 13 and an upper epitaxial layer 14 suitable for device formation. The substrate 12 is divided into an active region 16 and an inactive region 18. The regions 16, 18 are separated, for illustration purposes only, by a border line 20.

The inactive region 18 comprises a gettering trench 22. It also comprise various passive devices 24 such as metal lines, thin film resistors and capacitors. Those passive devices 24 can also be built on a dielectric layer that is deposited over the gettering trench 22. The gettering trench 22 and the inactive region 18 can be located anywhere on the front surface 13 in the epitaxial layer 14, in particular on scribe line areas 23 of the substrate 12. Preferably, the gettering trench 22 is sufficiently spaced from the active region 16 to attract defects and impurities away from the active region 16.

The active region 16 comprises one or more active device(s) 26. The active device(s) 26 form an integrated circuit including diodes, bipolar transistors, field effect transistors (FET) or MOSFET. The active device(s) 26 is surrounded by a frame trench 32. Other devices are adjacent linear trenches, such as device 29 and linear trench 30. The frame trench 32 surrounds the active device 26 and dielectrically isolates the surrounded active device 26 from other devices (passive and active) in the active region 16. Moreover, the active device 26 can be either a conventional junction isolated device or a conventional silicon-on-insulator device.

Figure 2:
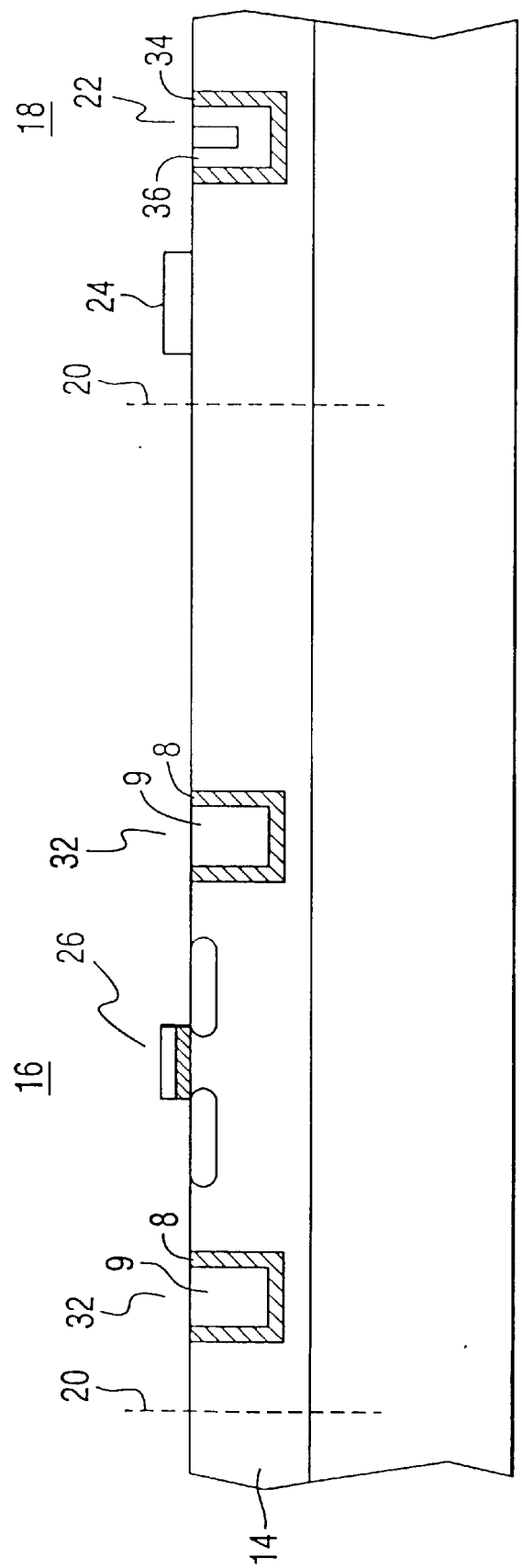
FIG. 2 is a cross-sectional view of FIG. 1 taken along the lines 2—2.

FIG. 2 illustrates a cross-sectional view of FIG. 1 taken along lines 2—2. The gettering trench 22 comprises a dielectric layer 34 on the sidewalls and the floor of the trench and the remainder of the trench comprises a filling material 36. The filling material 36 and the dielectric layer 34 are, respectively, polysilicon and silicon dioxide. The frame trench 32 around device 26 has an oxide layer 8 on its sidewalls and floor. The rest of the trench is filled with polysilicon 9.

Figure 3A:
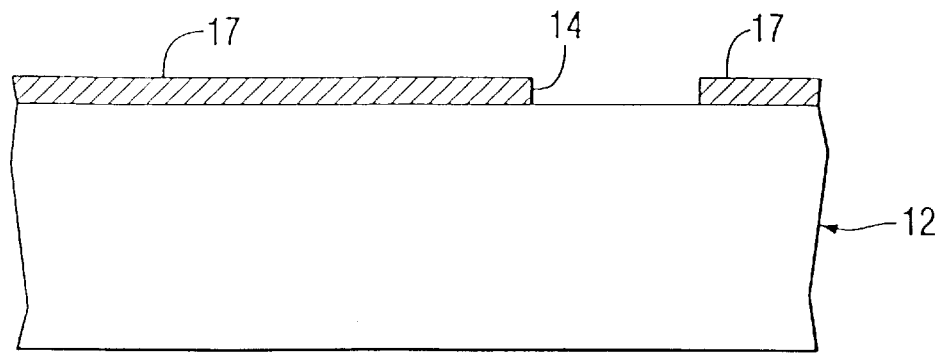
FIGS. 3a–3f are the process steps to form the present invention.
Figure 3B:
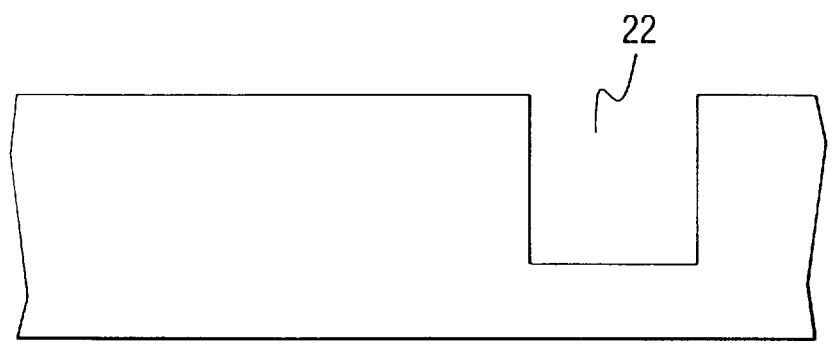
Figure 3C:
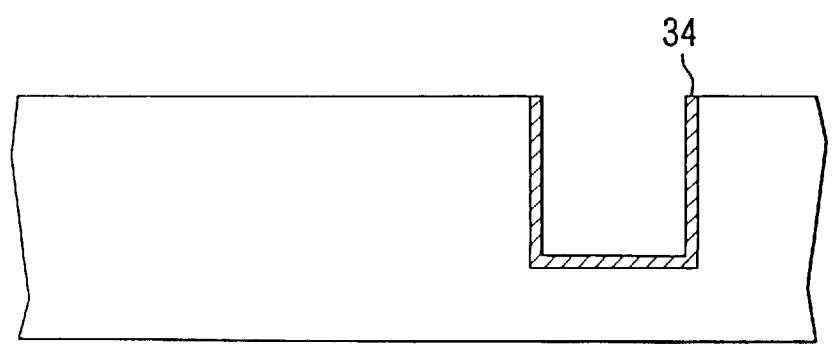

FIGS. 3a–3i illustrate the process to fabricate the gettering trench 22 in the integrated circuit structure 10 shown in FIGS. 1 and 2. The gettering trench process sequence begins, as shown in FIG. 3a, with the monocrystalline semiconductor device substrate 12, preferably silicon. A mask layer 17 is patterned on the upper portion 14 in a conventional manner to define the gettering trench 22. A dry etch, anisotropic and relatively selective to silicon, is applied to extend the gettering trench 22 through the substrate 12 to a desired level. The desired level includes and is not limited to a level within the substrate 12. The mask layer (e.g., photoresist) is then stripped by conventional means. With the exposed gettering trench 22 prepared as shown in FIG. 3b, a subsequent thermal or deposited oxide 34 is formed as shown in FIG. 3c. The oxide 34 covers the sidewalls and the floor of the trench. 22. Other suitable dielectric materials can be used for layer 34. The oxide on the front surface 13 of the substrate may be is removed after the sidewall and floor of the trench are coated with oxide.

Figure 3D:
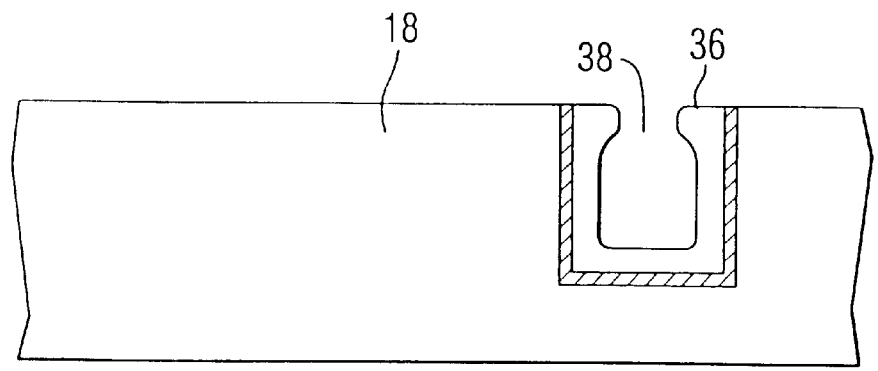
Figure 3E:
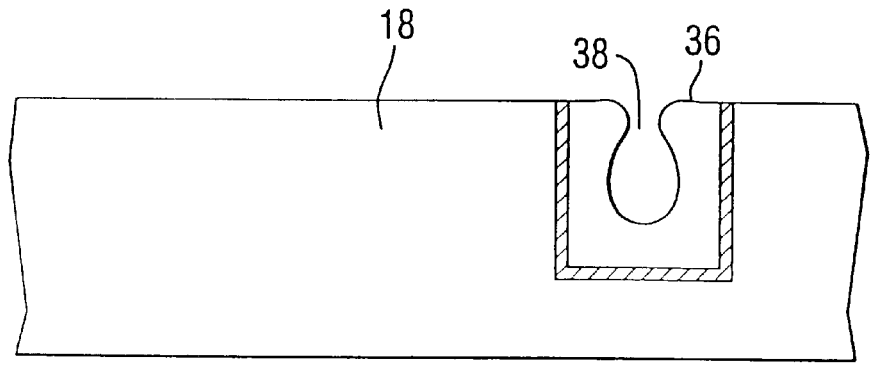
Figure 3F:
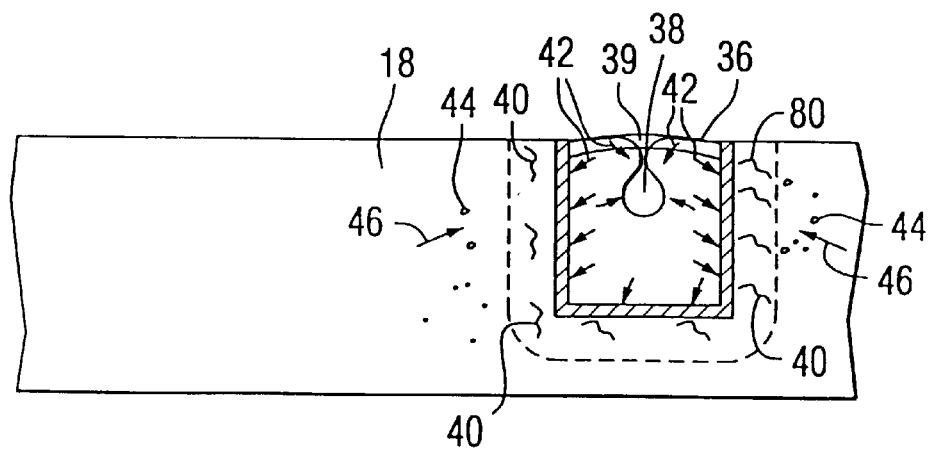

Turning to FIGS. 3d–3f, the filling material 36, polysilicon or other suitable material, is applied to the remainder of the unfilled gettering trench 22 shown in FIG. 3c. As shown progressively in FIGS. 3d–3f, a void 38 is intentionally fabricated inside the gettering trench 22. Those skilled in the art know that the rate and total amount of deposited polysilicon can be adjusted to generate voids. The void 38 is located near the center of the gettering trench 22 and preferably on the top center portion of the gettering trench 22. The void 38 has a width ranging from 0.01 to 6 microns.

The polysilicon is oxidized. During oxidation a thermal oxide layer 39 forms on the polysilicon. The layer 39 closes the void 38 and generates stress-induced crystal defects 40. The oxidized filling material 39 applies pressure, indicated as arrows 42, to the void 38 and the substrate 12. The pressure at the closed void 38 and on the substrate 12 induces stress in the adjacent inactive region 18 and generates the defects 40 in the monocrystalline semiconductor 12. Such defects 40 create a gettering zone 80 that surrounds the trench 22. The gettering zone 80 attracts impurities 44 (see arrows 46). The impurities 44 include metallic contaminants. The impurities 44 are gettered from the active region 16.

Figure 4:
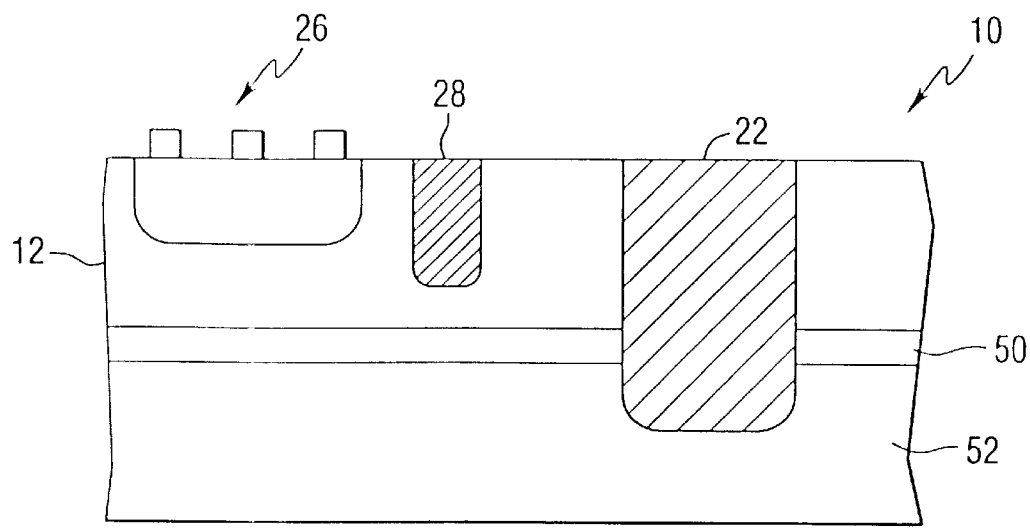
FIG. 4 is a second embodiment of FIG. 2.
Figure 5:
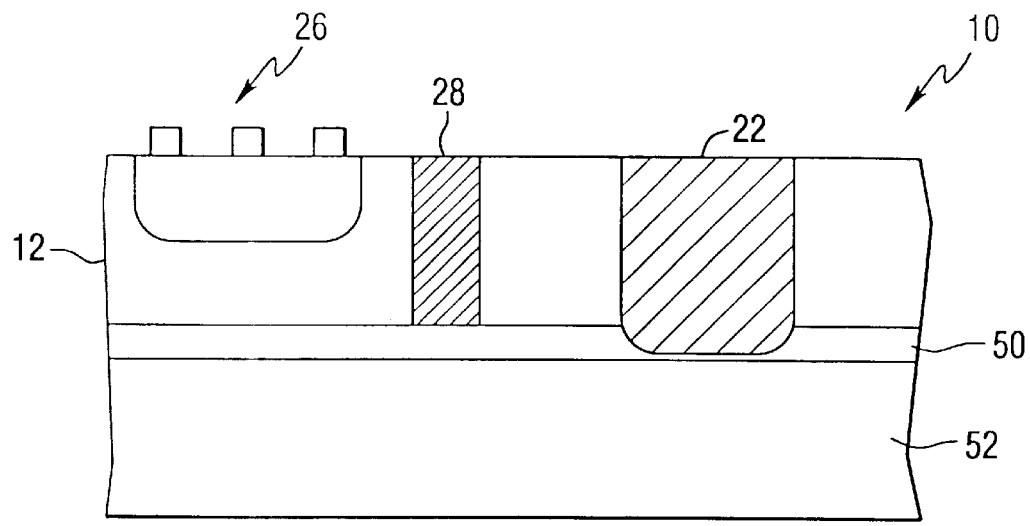
FIG. 5 is a third embodiment.

FIGS. 4 and 5 illustrate respectively the second and third embodiments of the present invention. In particular, FIGS. 4 and 5 illustrate the integrated circuit structure 10 comprises the device substrate 12 on a dielectric bonding layer 50 and a handle substrate 52. In FIG. 4, the gettering trench 22 extends into the handle substrate 52 for an alternative desired level. In contrast, FIG. 5 illustrates the gettering trench 22 extends into the dielectric bonding layer 50 for another alternative desired level. The bottom of trench 22 may also terminate inside the device substrate 12. By placing the polysilicon gettering site on the front surface of the device wafer, the invention provides a solution to the problem of gettering silicon-on-insulator devices. Such devices have the back surface of the device substrate covered with oxide. Conventional backside gettering layers are blocked by the insulation layer on the back side of the device substrate. The invention solves that problem be placing the gettering site on the front side of the device substrate.

The fourth embodiment of the invention is shown in FIG. 6. Conventional methods provide a trench 71 in device substrate 70. The trench is filled with polysilicon 72. Polysilicon is a gettering agent and attracts heavy contaminant metals such as iron. The device wafer is planarized to bring the polysilicon fill and the front surface of the device wafer to a common planar surface 74. Polysilicon covers the sidewalls and the floor of the trench 71.

The fifth embodiment of the invention shown in FIG. 7. It combines the features of the embodiments shown in FIGS. 3g and 6. The fifth embodiment has two gettering mechanisms: the polysilicon 84 and the stress gettering zone 82. The trench 81 in device substrate 80 is underfilled with polysilicon. The polysilicon covers the sidewalls and the floor and is a first gettering mechanism. The voided portion of the polysilicon is oxidized 86 to created a stress gettering zone 82 around the trench 84. The residual, unoxidized polysilicon 84 induces stress defects to create the second gettering mechanism.

FIGS. 8 and 9 show process steps leading to the structure of FIG. 10. Trenches with underfilled, oxidized polysilicon may leave undesired artifacts on the front surface of the substrate. Ridges or cavities in the polysilicon or the oxide may interfere with subsequent process steps. To preclude such interference, the gettering trench 91 is re-etched and processed along with other trenches, such as isolation trenches 30, 32 of FIG. 1.

The gettering trench 91 is formed in device substrate 90. The trench 91 has a sidewall oxide layer 94. A layer or polysilicon 96 underfills the trench 91. See FIG. 9. The underfilled polysilicon 96 is partially oxidized 98 to create stress region 92 that surrounds the trench 91.

Using the same mask 100 as the isolation trenches 32 (FIG. 1) in the integrated circuit, the polysilicon 96 and the oxides 94, 98 are etched from the trench 91. The stress region 92 remains. The process to fabricate voidless isolation trenches is disclosed in U.S. Pat. No. 5,448,102 (commonly assigned) which is incorporated by reference. The process includes planarizing the trench fill material to bring the surface of the device substrate and the gettering trench to a common planar surface 106. Passive devices 24 are fabricated onto at least a portion of the gettering trench as described above. Alternatively, the passive devices 24 can be fabricated on the inactive region 18 or active region 16 at any time during the process so long as the passive devices do not interfere with the formation of the gettering trench 91, the isolation trench (30 or 32 of FIG. 1) or the active device(s). The passive devices 24 are fabricated by conventional processes. The sidewall oxide layer 102 on the isolation trenches is also formed on the gettering trench 91. The material filling the isolation trench 104, typically polysilicon, also fills the gettering trench 91. The entire device substrate is then planarized to a common surface 106. The method shown in FIGS. 8–10 uses underfilled/oxidized embodiment of FIGS. 1 and 3F. However, those skilled in the art will understand that any of the embodiments of the invention can be made simultaneously with the isolation trenches. Likewise, any of the embodiments of the invention may be made with a bonded wafer or other silicon-on-insulator structure as well as bulk devices and other non-soi structures.

While the method(s) herein described, and the form(s) of apparatus for carrying this (these) method(s) into effect, constitute preferred embodiments of this invention, the invention is not limited to this (these) precise method(s) and form(s) of apparatus, and that changes may be made in either without departing from the scope of the invention, which is defined in the appended claims.

We claim the following:

1. A method of forming an integrated circuit structure comprising the steps of:

providing a monocrystalline semiconductor device substrate having an upper portion suitable for device formation;

dividing the upper portion of said semiconductor substrate into at least one inactive region and at least one active region;

forming at least one active device in the active region;

etching a gettering trench in the front surface of the substrate in the inactive region and spaced from the active region;

depositing an oxide layer on the sidewalls and floor of the gettering trench;

depositing a layer of polysilicon on the oxide layer to underfill the trench, leaving a void near the middle of said trench; and oxidizing at least a portion of the deposited polysilicon thereby closing the void and stressing the device substrate and inducing a region of crystal lattice defects in the device substrate in a region surrounding the gettering trench for attracting impurities toward said trench and away from the active region.

2. The method of claim 1 comprising the further step of re-etching the gettering trench to remove gettering material and refilling the gettering trench with a second gettering material.

3. The method of claim 2 comprising the further step of planarizing the second gettering material.

4. The method of claim 2 wherein the second gettering material has no voids.

5. The method of claim 1 comprising the further step of etching a second trench in the active region and filling the second trench with a third filling material.

6. The method of claim 5 wherein the second trench is a frame trench surrounding the device and diclectrically isolating the surrounded device from other devices in the active region.

7. The method of claim 5 wherein the second trench is a linear trench located between two devices in the active region.

8. The method of claim 1 further comprising the step of forming a passive device on the inactive region.

9. The method of claim 1 wherein the gettering trench is on a scribe line area of the substrate.

10. The method of claim 2 wherein said second gettering material comprises polysilicon.

11. The method of claim 1 further comprising the step of forming a dielectric layer between a handle substrate and the device substrate for electrically isolating the handle substrate from the device substrate and for bonding the handle substrate to a monocrystalline semiconductor layer.

12. The method of claim 1 further comprising the step of forming an epitaxial layer on the monocrystalline device substrate.

13. The method of claim 11 wherein the gettering trench terminates in the device substrate.

14. The method of claim 11 wherein the gettering trench terminates in the dielectric layer between the device and handle substrates.

15. The method of claim 11 wherein the gettering trench terminates in the handle substrate.

16. A method of forming an integrated circuit structure comprising the steps of:

providing a monocrystalline semiconductor device substrate having an upper portion suitable for device formation;

dividing the upper portion of said semiconductor substrate into at least one inactive region and at least one active region;

forming at least one active device in the active region;

etching a gettering trench in the front surface of the substrate in the inactive region and spaced from the active region;

covering the sidewalls and floor of the gettering trench with polysilicon, thereby providing a gettering mechanism;

filling the gettering trench with polysilicon and planarizing said polysilicon; and underfilling the gettering trench with polysilicon and oxidizing a portion of said polysilicon, thereby creating a stress gettering zone around said gettering trench and providing a second gettering mechanism.

* * * * *